(12) United States Patent
Kobayashi et al.

(10) Patent No.: US 12,220,747 B2
(45) Date of Patent: Feb. 11, 2025

(54) CUTTING TOOL

(71) Applicant: Sumitomo Electric Hardmetal Corp., Itami (JP)

(72) Inventors: Fumiyoshi Kobayashi, Itami (JP); Susumu Okuno, Itami (JP); Anongsack Paseuth, Itami (JP); Shinya Imamura, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 602 days.

(21) Appl. No.: 17/600,612

(22) PCT Filed: May 18, 2020

(86) PCT No.: PCT/JP2020/019650
§ 371 (c)(1),
(2) Date: Oct. 1, 2021

(87) PCT Pub. No.: WO2020/250625
PCT Pub. Date: Dec. 17, 2020

(65) Prior Publication Data
US 2022/0193787 A1    Jun. 23, 2022

(30) Foreign Application Priority Data
Jun. 11, 2019    (JP) .................................. 2019-108735

(51) Int. Cl.
*B23B 27/14*    (2006.01)
*B23C 5/16*    (2006.01)
(Continued)

(52) U.S. Cl.
CPC ................ *B23B 27/14* (2013.01); *B23C 5/16* (2013.01); *C23C 16/36* (2013.01); *C23C 16/402* (2013.01);
(Continued)

(58) Field of Classification Search
None
See application file for complete search history.

(56) References Cited

U.S. PATENT DOCUMENTS

2004/0224159 A1    11/2004    Oshika et al.
2007/0184272 A1    8/2007    Moriguchi
(Continued)

FOREIGN PATENT DOCUMENTS

JP    2004-284003 A    10/2004
JP    2006-35345 A    2/2006
(Continued)

OTHER PUBLICATIONS

Office Action issued Jun. 21, 2024 in co-pending U.S. Appl. No. 17/600,610, 27 pages.
(Continued)

*Primary Examiner* — Seth Dumbris
(74) *Attorney, Agent, or Firm* — XSENSUS LLP

(57) ABSTRACT

A cutting tool including a rake face and a flank face includes: a substrate; and a coating film disposed on the substrate, wherein the coating film includes an $Al_2O_3$ layer, residual stress of the $Al_2O_3$ layer has a minimum value $R_{min}$ at at least a portion of a region d1 of the rake face, the minimum value $R_{min}$ is more than −0.27 GPa and less than or equal to −0.1 GPa.

17 Claims, 7 Drawing Sheets

(51) Int. Cl.
*C23C 16/36* (2006.01)
*C23C 16/40* (2006.01)
*C23C 28/04* (2006.01)

(52) U.S. Cl.
CPC .......... *C23C 28/042* (2013.01); *C23C 28/044* (2013.01); *B23B 2224/04* (2013.01); *B23B 2224/32* (2013.01); *B23C 2224/04* (2013.01); *B23C 2224/32* (2013.01)

(56) References Cited

U.S. PATENT DOCUMENTS

| | | | |
|---|---|---|---|
| 2007/0298280 A1* | 12/2007 | Omori | C23C 28/042 51/307 |
| 2008/0131218 A1* | 6/2008 | Omori | B23B 27/141 407/114 |
| 2009/0067938 A1 | 3/2009 | Omori et al. | |
| 2009/0097933 A1 | 4/2009 | Omori et al. | |
| 2009/0232611 A1 | 9/2009 | Omori et al. | |
| 2010/0255354 A1* | 10/2010 | Taya | H01M 50/262 429/97 |
| 2012/0275870 A1 | 11/2012 | Paseuth et al. | |

FOREIGN PATENT DOCUMENTS

| | | |
|---|---|---|
| JP | 2007-319964 A | 12/2007 |
| JP | 2009-269097 A | 11/2009 |
| JP | 2011-206907 A | 10/2011 |
| WO | 2008/026433 A1 | 3/2008 |
| WO | 2012/132032 A1 | 10/2012 |

OTHER PUBLICATIONS

U.S. Advisory Action issued Nov. 25, 2024 in co-pending U.S. Appl. No. 17/600,610, 5 pages.

* cited by examiner

DISTANCE FROM RIDGELINE
OF CUTTING EDGE(mm)

CUTTING TOOL

CROSS-REFERENCE TO RELATED APPLICATIONS

The present application is based on PCT filing PCT/JP2020/019650, filed May 18, 2020, which claims priority to JP 2019-108735, filed Jun. 11, 2019, the entire contents of each are incorporated herein by reference. This disclosure is also related to co-pending U.S. application Ser. No. 17/600,610, which is entitled: CUTTING TOOL, filed concurrently with the present application, which is also incorporated herein by reference.

TECHNICAL FIELD

The present disclosure relates to a cutting tool.

BACKGROUND ART

As a recent trend for cutting tools, an amount of cut or an amount of feeding has been increased to further improve processing efficiency, with the result that cutting tools are used in a severer environment. In particular, as characteristics required for each of the cutting tools (substrates and coating films), it becomes more important to attain not only stability (oxidation resistance, adhesion of the coating film, and the like) of the coating film at a high temperature, but also improved breakage resistance (chipping resistance) to accommodate a large amount of cut and a large amount of feeding.

CITATION LIST

Patent Literature

PTL 1: Japanese Patent Laying-Open No. 2004-284003
PTL 2: WO 2012/132032

SUMMARY OF INVENTION

A cutting tool according to an embodiment of the present disclosure is a cutting tool including a rake face and a flank face, the cutting tool including:
a substrate; and
a coating film disposed on the substrate, wherein
the coating film includes an $Al_2O_3$ layer,
residual stress of the $Al_2O_3$ layer has a minimum value $R_{min}$ at at least a portion of a region d1 in the rake face,
the minimum value $R_{min}$ is more than −0.27 GPa and less than or equal to −0.1 GPa,
in a case where the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, the imaginary line D2 being separated by 3 mm from the imaginary ridgeline on the rake face, and
in a case where the rake face and the flank face are connected to each other via a ridgeline, the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

DETAILED DESCRIPTION

Figure 1:
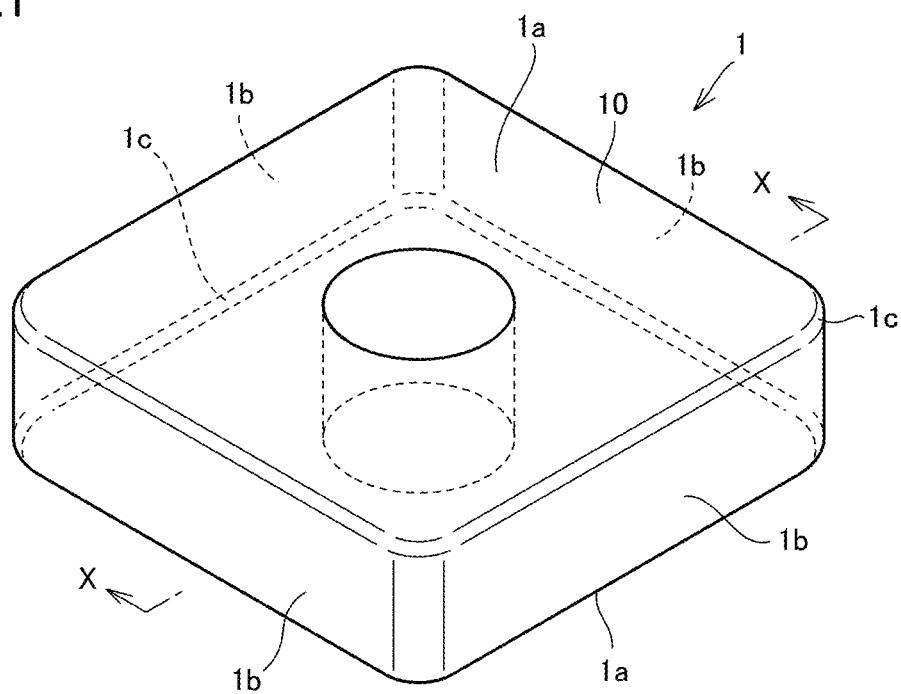
FIG. 1 is a perspective view illustrating one implementation of a cutting tool.

Problem to be Solved by the Present Disclosure

In order to improve wear resistance and surface protection function, it has been known to form a hard coating film such as TiN, TiC, TiCN, or $Al_2O_3$ on a surface of a hard substrate of a cutting tool or wear-resistant tool of tungsten carbide (WC) based cemented carbide, cermet, high-speed steel or the like. In particular, an aluminum oxide layer ($\alpha$-$Al_2O_3$) having an $\alpha$-type crystal structure is excellent in mechanical characteristics and is widely used, but needs to have improved breakage resistance.

Japanese Patent Laying-Open No. 2004-284003 (PTL 1) describes that an $Al_2O_3$ layer exhibits excellent chipping resistance with grains oriented in a (001) plane being present in $\alpha$-$Al_2O_3$ by more than or equal to 70 area %.

However, in high-load processing, in addition to improvement in chipping resistance only by controlling the orientation plane, the following recent trends are becoming common: tensile stress caused by a difference in thermal expansion coefficient between the coating film and the substrate is reduced; compressive stress is introduced into the coating film; and the like.

WO 2012/132032 (PTL 2) describes that compressive stress is introduced into a film of an outermost layer in the vicinity of a cutting edge through a blasting process, thereby improving chipping resistance. However, it is described that the compressive residual stress is changed to tensile residual stress in a direction from the vicinity of the cutting edge to the rake face side or the flank face side, so that further improvement in chipping resistance is required particularly in the case of processing involving a larger load on the rake face side than a load on the cutting edge.

The present disclosure has been made in view of the above circumstances, and has an object to provide a cutting tool excellent in breakage resistance and wear resistance.

Advantageous Effect of the Present Disclosure

According to the above description, there can be provided a cutting tool excellent in breakage resistance and wear resistance.

Description of Embodiments

First, embodiments of the present disclosure are listed and described.

[1] A cutting tool according to one embodiment of the present disclosure is a cutting tool including a rake face and a flank face, the cutting tool including:
a substrate; and
a coating film disposed on the substrate, wherein
the coating film includes an $Al_2O_3$ layer,
residual stress of the $Al_2O_3$ layer has a minimum value $R_{min}$ at at least a portion of a region d1 in the rake face,
the minimum value $R_{min}$ is more than −0.27 GPa and less than or equal to −0.1 GPa,
in a case where the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, the imaginary line D2 being separated by 3 mm from the imaginary ridgeline on the rake face, and
in a case where the rake face and the flank face are connected to each other via a ridgeline, the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

Since the cutting tool has such a configuration as described above, the cutting tool is excellent in breakage resistance and wear resistance.

[2] In the case where the rake face and the flank face are connected to each other via the cutting edge face, a cutting edge portion is a region interposed between a boundary line between the rake face and the cutting edge face and a boundary line between the flank face and the cutting edge face,
in the case where the rake face and the flank face are connected to each other via the ridgeline, the cutting edge portion is a region interposed between the ridgeline and an imaginary line D3 separated by 500 μm from the ridgeline on the rake face and a region interposed between the ridgeline and an imaginary line D4 separated by 500 μm from the ridgeline on the flank face, and
residual stress of the $Al_2O_3$ layer at the cutting edge portion is more than or equal to −0.08 GPa and less than or equal to 0 GPa. By defining in this way, the cutting tool becomes more excellent in breakage resistance.

[3] The coating film further includes an inner layer provided between the substrate and the $Al_2O_3$ layer, and the inner layer is composed of a compound represented by TiCN. By defining in this way, adhesion between the substrate and the $Al_2O_3$ layer is improved.

[4] The minimum value $R_{min}$ is more than −0.27 GPa and less than or equal to −0.15 GPa. By defining in this way, the cutting tool becomes more excellent in breakage resistance and wear resistance.

Details of Embodiments of the Present Disclosure

The following describes one embodiment (hereinafter, referred to as "the present embodiment") of the present disclosure. However, the present embodiment is not limited thereto. In the present specification, the expression "X to Y" represents a range of lower to upper limits (i.e., more than or equal to X and less than or equal to Y). When no unit is indicated for X and a unit is indicated only for Y, the unit of X is the same as the unit of Y. Further, in the present specification, when a compound is expressed by a chemical formula in which a composition ratio of composition elements is not limited such as "TiN", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiN" includes not only a stoichiometric composition "$Ti_1N_1$" but also a non-stoichiometric composition such as "$Ti_1N_{0.8}$". The same also applies to compounds other than the "TiN".

<<Surface-Coated Cutting Tool>>

A cutting tool according to the present disclosure is a cutting tool including a rake face and a flank face, the cutting tool including:
a substrate; and
a coating film disposed on the substrate, wherein
the coating film includes an $Al_2O_3$ layer,
residual stress of the $Al_2O_3$ layer has a minimum value $R_{min}$ at at least a portion of a region d1 in the rake face,
the minimum value $R_{min}$ is more than −0.27 GPa and less than or equal to −0.1 GPa,
in a case where the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, the imaginary line D2 being separated by 3 mm from the imaginary ridgeline on the rake face, and
in a case where the rake face and the flank face are connected to each other via a ridgeline, the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

The surface-coated cutting tool (hereinafter, also simply referred to as "cutting tool") of the present embodiment includes a substrate and a coating film that coats the substrate. In one aspect of the present embodiment, it is also understandable that the cutting tool includes a substrate and a coating film disposed on the substrate. Examples of the above-described cutting tool include a drill, an end mill (for example, a ball end mill), an indexable cutting insert for drill, an indexable cutting insert for end mill, an indexable cutting insert for milling, an indexable cutting insert for turning, a metal saw, a gear cutting tool, a reamer, a tap, and the like.

The cutting tool includes a rake face and a flank face. The "rake face" means a surface that rakes out swarf from a workpiece. The "flank face" means a surface having a portion to be brought into contact with a workpiece. Depending on a shape of the cutting tool, the cutting tool is classified into one of the following two cases: "a case where the rake face and the flank face are connected to each other via a cutting edge face"; or "a case where the rake face and the flank face are connected to each other via a ridgeline". Hereinafter, an indexable cutting insert (FIGS. 1 to 6) will be described as a specific example.

Figure 2:
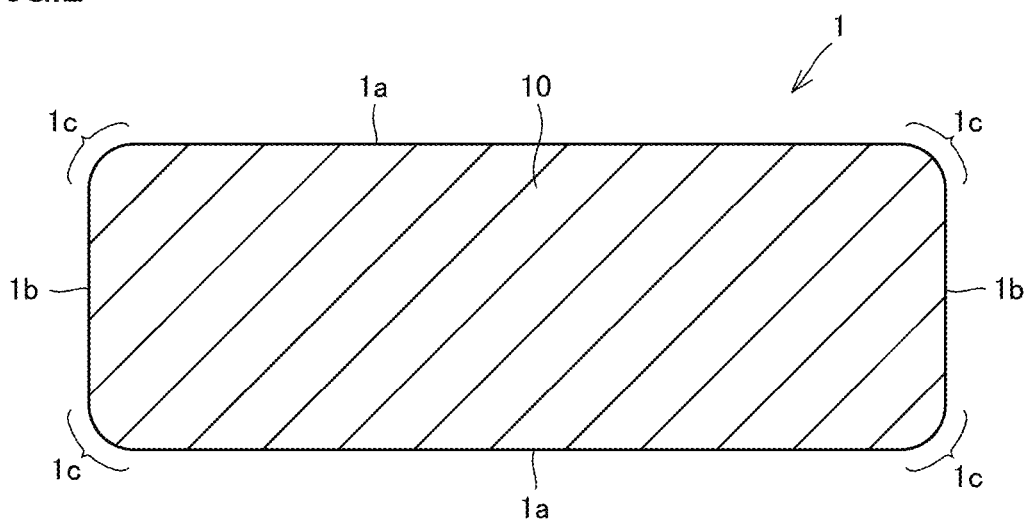
FIG. 2 is a cross sectional view taken along a line X-X in FIG. 1.

FIG. 1 is a perspective view illustrating one implementation of the cutting tool, and FIG. 2 is a cross sectional view taken along a line X-X in FIG. 1. The cutting tool having such a shape is used as an indexable cutting insert such as an indexable cutting insert for turning.

Cutting tool 1 shown in FIGS. 1 and 2 has surfaces including an upper surface, a lower surface, and four side surfaces, and has a quadrangular prism shape that is slightly thin in the upward/downward direction as a whole. Further, cutting tool 1 is provided with a through hole extending through the upper and lower surfaces, and adjacent side surfaces are connected to each other by an arc surface at each of boundary portions between the four side surfaces.

In cutting tool 1, each of the upper and lower surfaces forms a rake face 1a, each of the four side surfaces (and the arc surfaces connecting them) forms a flank face 1b, and an arc surface connecting rake face 1a and flank face 1b to each other forms a cutting edge face 1c (FIG. 2). It should be noted that in FIGS. 1 to 6, rake face 1a is smooth but may be provided with unevenness such as a chip breaker.

Figure 3:
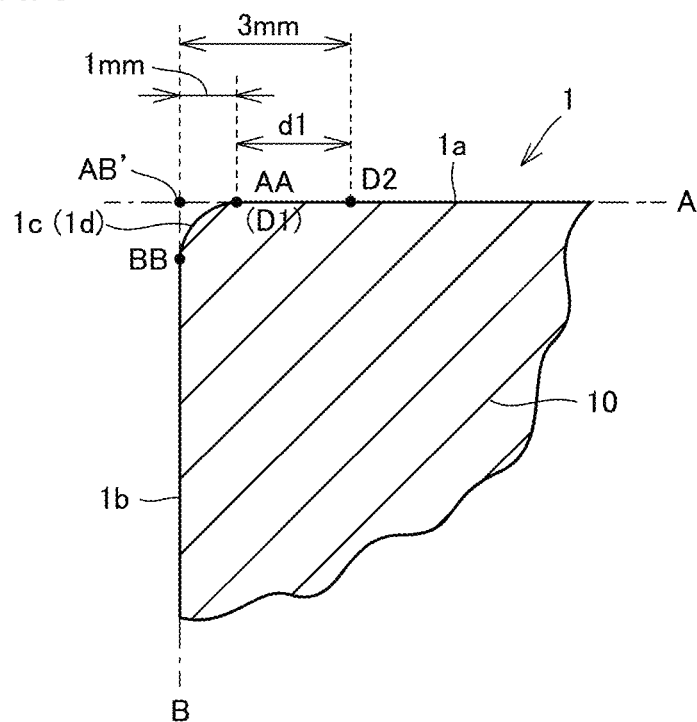
FIG. 3 is a partial enlarged view of FIG. 2.

FIG. 3 is a partial enlarged view of FIG. 2. FIG. 3 shows an imaginary plane A, an imaginary boundary line AA, an imaginary plane B, an imaginary boundary line BB, and an imaginary ridgeline AB'.

Imaginary plane A corresponds to a plane obtained by extending rake face 1a. Boundary line AA is a boundary line between rake face 1a and cutting edge face 1c. Imaginary plane B corresponds to a plane obtained by extending flank face 1b. Boundary line BB is a boundary line between flank face 1b and cutting edge face 1c. Imaginary ridgeline AB' is an intersection line between the plane (imaginary plane A) obtained by extending rake face 1a and the plane (imaginary plane B) obtained by extending flank face 1b. That is, imaginary plane A and imaginary plane B intersect with each other to form imaginary ridgeline AB'.

In the case shown in FIG. 3, cutting edge face 1c is an arc surface (honed surface), and rake face 1a and flank face 1b are connected to each other via cutting edge face 1c. In the case where rake face 1a and flank face 1b are connected to each other via cutting edge face 1c, cutting edge portion 1d of cutting tool 1 is constituted of a region (i.e., cutting edge face 1c) interposed between boundary line AA between rake face 1a and cutting edge face 1c and boundary line BB between flank face 1b and cutting edge face 1c.

It should be noted that in FIG. 3, each of imaginary plane A and imaginary plane B is shown in the form of a line, and each of boundary line AA, boundary line BB, and imaginary ridgeline AB' is shown in the form of a dot.

Figure 4:
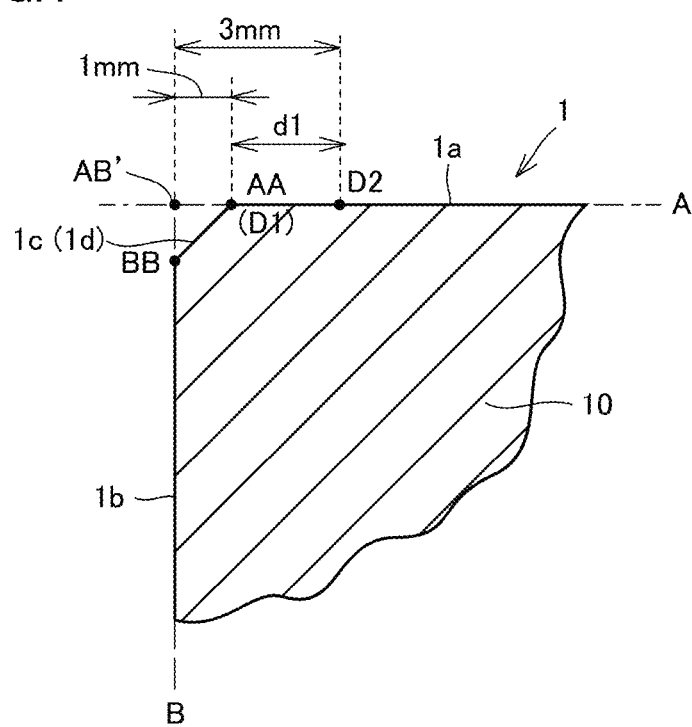
FIG. 4 is a cross sectional view illustrating another shape of a cutting edge face.

Although FIGS. 1 to 3 show the case where cutting edge face 1c is an arc surface (honed surface), the shape of cutting edge face 1c is not limited to this. For example, as shown in FIG. 4, cutting edge face 1c may have a flat shape (negative land). Further, as shown in FIG. 5, cutting edge face 1c may have a shape in which both the flat surface and the arc surface are present (a shape in combination of the honed surface and the negative land).

Figure 5:
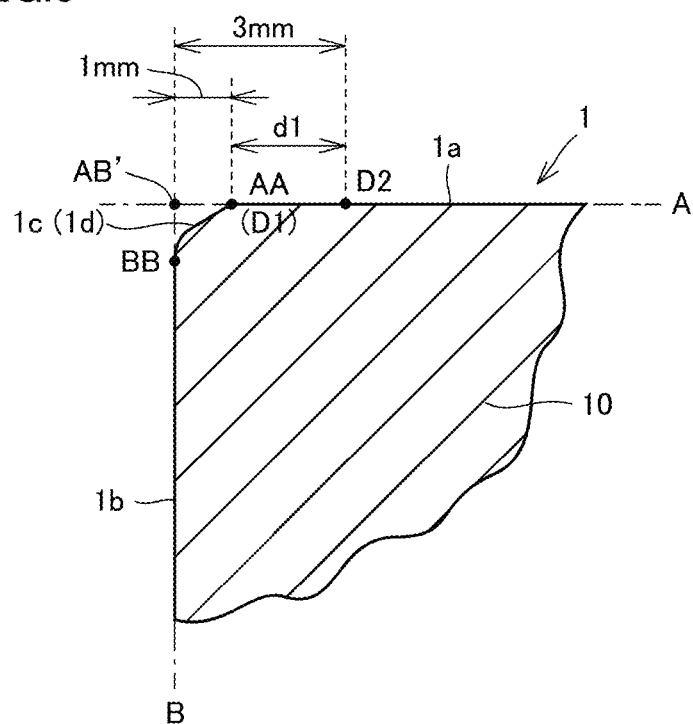
FIG. 5 is a cross sectional view illustrating still another shape of the cutting edge face.

As with the case shown in FIG. 3, also in each of the cases shown in FIGS. 4 and 5, rake face 1a and flank face 1b are connected to each other via cutting edge face 1c, and imaginary plane A, boundary line AA, imaginary plane B, boundary line BB, and imaginary ridgeline AB' are set.

That is, each of the cases shown in FIGS. 3 to 5 is included in the "case where the rake face and the flank face are connected to each other via the cutting edge face".

When cutting tool 1 has such a shape as shown in each of FIGS. 3 to 5 as described above, cutting edge face 1c can be determined only from the shape. This is because cutting edge face 1c in this case is not included in each of imaginary plane A and imaginary plane B and is therefore visually distinguishable from rake face 1a and flank face 1b. Here, in one aspect of the present embodiment, it is assumed that a case where a distance between boundary line AA and boundary line BB in each of FIGS. 3 to 5 is less than or equal to 5 μm is included in the below-described "case where the rake face and the flank face are connected to each other via the ridgeline". This is due to the following reason: in the case where the distance between boundary line AA and boundary line BB is less than or equal to 5 μm, it is considered difficult to visually distinguish cutting edge face 1c from rake face 1a and flank face 1b.

In general, cutting edge face 1c may be a surface of a below-described substrate 10 in cutting tool 1, and may be formed by performing mechanical processing onto a ridge between intersecting surfaces. In other words, substrate 10 is formed by performing mechanical processing onto at least a portion of a surface of a substrate precursor composed of a sintered material or the like, and cutting edge face 1c may include a surface formed through chamfering by the mechanical processing.

Figure 6:
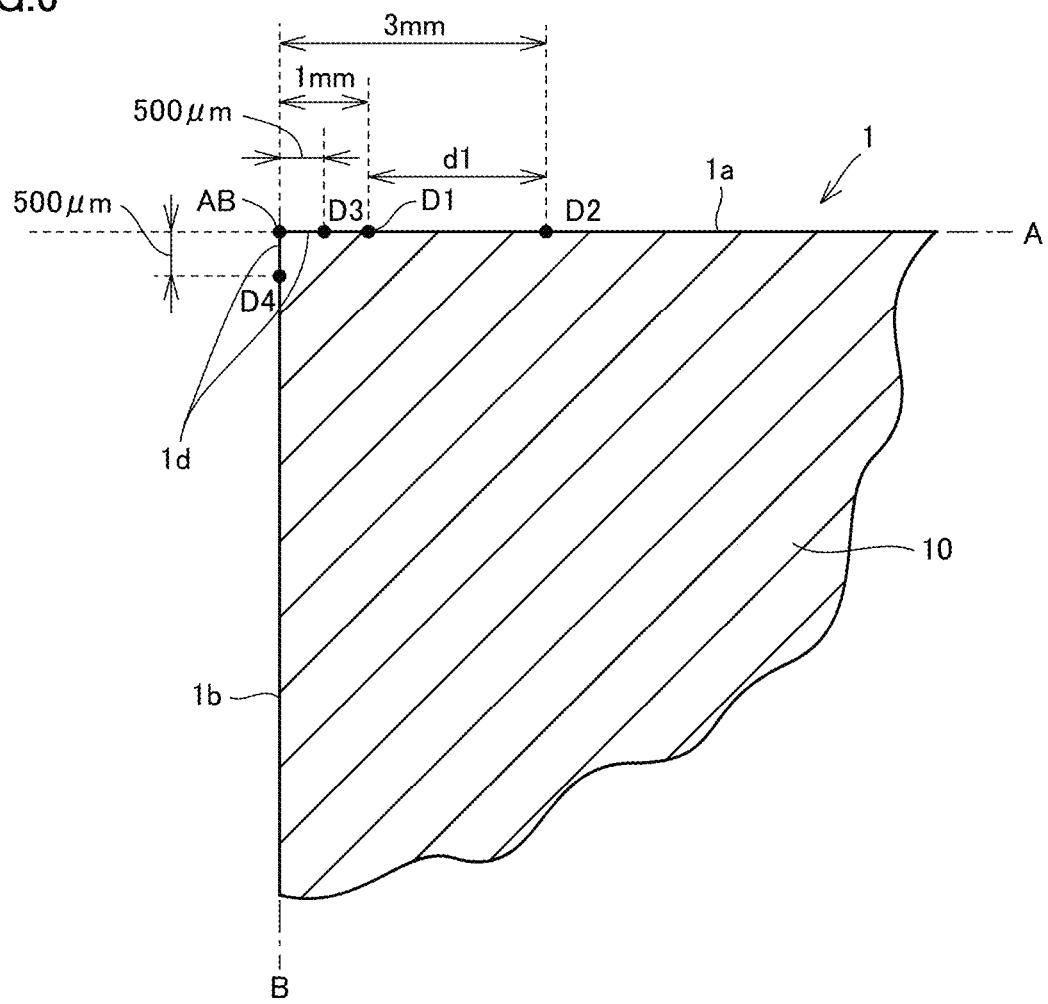
FIG. 6 is a cross sectional view illustrating yet another shape of the cutting edge face.

On the other hand, a case where cutting tool 1 has such a sharp edge shape as shown in FIG. 6 is included in the "case where the rake face and the flank face are connected to each other via the ridgeline".

In the case shown in FIG. 6, cutting edge face 1c shown in each of FIGS. 3 to 5 is not present and rake face 1a and flank face 1b are contiguous to each other. In the case where rake face 1a and flank face 1b are connected to each other via ridgeline AB, cutting edge portion 1d of cutting tool 1 is constituted of a region interposed between ridgeline AB and an imaginary line D3 separated by 500 μm from ridgeline AB on rake face 1a and a region interposed between ridgeline AB and an imaginary line D4 separated by 500 μm from ridgeline AB on flank face 1b.

Although the shapes of cutting tool 1 and the names of the respective portions thereof have been described above with reference to FIGS. 1 to 6, the same terms as those described above will be used for shapes corresponding to cutting tool 1 and names of respective portions thereof in substrate 10 of the cutting tool according to the present embodiment. That is, substrate 10 of the cutting tool has rake face 1a and flank face 1b.

<Substrate>

For the substrate of the present embodiment, any conventionally known substrate for such a purpose of use can be used. For example, the substrate preferably includes at least one selected from a group consisting of: a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel; a ceramic (titanium carbide, silicon carbide, silicon nitride, aluminum nitride, aluminum oxide, or the like); a cubic boron nitride sintered material (cBN sintered material); and a diamond sintered material.

Among these various types of substrates, it is preferable to select the cemented carbide (particularly, the WC-based cemented carbide) or to select the cermet (particularly, the TiCN-based cermet). This is due to the following reason: each of these substrates is excellent in balance between hardness and strength particularly at a high temperature, and has an excellent characteristic as a substrate of a cutting tool for the above-described purpose of use.

When the cemented carbide is used as the substrate, the effect of the present embodiment is exhibited even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cermet, a surface hardened layer may be formed. Even when the surface is thus modified, the effect of the present embodiment is exhibited.

<Coating Film>

The coating film according to the present embodiment includes an $Al_2O_3$ layer provided on the substrate. The "coating film" has a function of improving various characteristics in the cutting tool such as breakage resistance, wear resistance, and the like by coating at least a portion (for example, the rake face to be brought into contact with swarf during cutting, or the like) of the substrate. The coating film may coat a portion of the substrate but preferably coats the entire surface of the substrate. However, a coating film that does not coat a portion of the substrate and a coating film having a partially different configuration are not deviated from the scope of the present embodiment.

The thickness of the coating film is preferably more than or equal to 3 μm and less than or equal to 30 μm, and is more preferably more than or equal to 5 μm and less than or equal to 25 μm. Here, the thickness of the coating film refers to a total of respective thicknesses of layers included in the coating film. Examples of the "layers included in the coating film" include an $Al_2O_3$ layer, an underlying layer, an inner layer, an intermediate layer, an outermost layer, and the like, which will be described below. The thickness of the coating film can be determined, for example, as follows: a scanning transmission electron microscope (STEM) is used to measure thicknesses at ten arbitrary points in a cross sectional sample parallel to the normal direction of the surface of the substrate, and the average value of the measured thicknesses at the ten points is determined. The same applies to respective measurements of the thicknesses of the $Al_2O_3$ layer, the underlying layer, the inner layer, the intermediate layer, the outermost layer, and the like, which will be described below. Examples of the scanning transmission electron microscope include JEM-2100F (trademark) provided by JEOL.

($Al_2O_3$ Layer)

The $Al_2O_3$ layer of the present embodiment includes α-$Al_2O_3$ (aluminum oxide having an α-type crystal structure) crystal grains (hereinafter, also simply referred to as "crystal grains"). That is, the $Al_2O_3$ layer is a layer including polycrystalline α-$Al_2O_3$.

Figure 7:
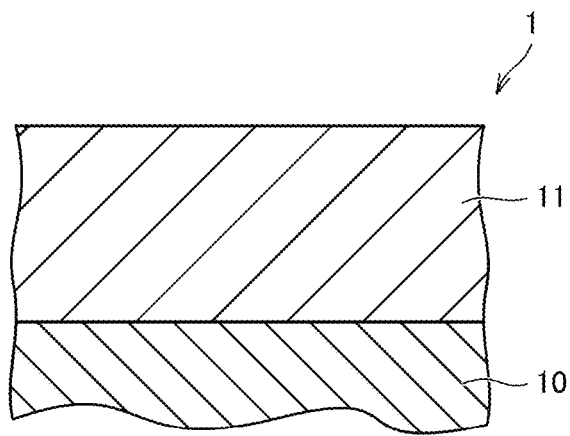
FIG. 7 is a schematic cross sectional view illustrating one implementation of the cutting tool.

The $Al_2O_3$ layer may be provided directly on the substrate (for example, FIG. 7) or may be provided on the substrate with another layer such as the below-described underlying layer, inner layer, or intermediate layer being interposed therebetween (for example, FIG. 8), as long as the effect of the cutting tool according to the present embodiment is not compromised. Another layer such as the outermost layer may be provided on the $Al_2O_3$ layer. Further, the $Al_2O_3$ layer may be the outermost layer (outermost surface layer) of the coating film.

The $Al_2O_3$ layer has the following feature. That is, residual stress of the $Al_2O_3$ layer has a minimum value $R_{min}$ at at least a portion of a region d1 in the rake face, and minimum value $R_{min}$ is more than −0.27 GPa and less than or equal to −0.1 GPa. Minimum value $R_{min}$ is preferably more than −0.27 GPa and less than or equal to −0.15 GPa. It should be noted that the above-described feature does not need to be satisfied at all the portions of the cutting edge of the cutting tool, and minimum value $R_{min}$ may be more than −0.27 GPa and less than or equal to −0.1 GPa at at least a portion of region d1 in a portion to be brought into contact with swarf during cutting.

In the present embodiment, "minimum value $R_{min}$" means the smallest residual stress value in a region interposed between the ridgeline (or imaginary ridgeline) and the imaginary line separated by 4 mm from the ridgeline on the rake face.

Here, in the case where the rake face and the flank face are connected to each other via the cutting edge face, region d1 is a region interposed between imaginary line D1 and imaginary line D2, imaginary line D1 being separated by 1 mm from the imaginary ridgeline on the rake face, the imaginary ridgeline being formed by intersection of the plane obtained by extending the rake face and the plane obtained by extending the flank face, imaginary line D2 being separated by 3 mm from the imaginary ridgeline on the rake face.

In the case where the rake face and the flank face are connected to each other via the ridgeline, region d1 is a region interposed between an imaginary line D1 and an imaginary line D2, imaginary line D1 being separated by 1 mm from the ridgeline on the rake face, imaginary line D2 being separated by 3 mm from the ridgeline on the rake face.

In one aspect of the present embodiment, the residual stress of the $Al_2O_3$ layer at the cutting edge portion is preferably more than or equal to −0.08 GPa and less than or equal to 0 GPa. Here, the cutting edge portion is defined differently for the following two cases. In the case where rake face 1a and flank face 1b are connected to each other via cutting edge face 1c, cutting edge portion 1d is a region interposed between boundary line AA between rake face 1a and cutting edge face 1c and boundary line BB between flank face 1b and cutting edge face 1c. It should be noted that in each of the schematic cross sectional views of FIGS. 3 to 5, imaginary line D1 and boundary line AA are shown to coincide with each other, but imaginary line D1 and boundary line AA may not coincide with each other.

On the other hand, in the case where rake face 1a and flank face 1b are connected to each other via ridgeline AB, cutting edge portion 1d is a region interposed between the ridgeline and imaginary line D3 separated by 500 μm from ridgeline AB on rake face 1a and a region interposed between ridgeline AB and imaginary line D4 separated by 500 μm from ridgeline AB on flank face 1b.

The term "residual stress" refers to a type of internal stress (intrinsic strain) present in a layer. The residual stress is roughly classified into compressive residual stress and tensile residual stress. The compressive residual stress refers to residual stress expressed by a negative numerical value (minus ("−")) (the unit therefor is expressed as "GPa" in the present specification). For example, a "compressive residual stress of 1 GPa" can be recognized as a residual stress of −1 GPa. Therefore, such a concept that the compressive residual stress is large indicates that the absolute value of the numerical value is large. Such a concept that the compressive residual stress is small indicates that the absolute value of the numerical value is small. Meanwhile, the tensile residual stress refers to residual stress expressed by a positive numerical value (plus ("+")). For example, a "tensile residual stress of 1 GPa" can be recognized as a residual stress of 1 GPa. Therefore, such a concept that the tensile residual stress is large indicates that the numerical value is large. Such a concept that the tensile residual stress is small indicates that the numerical value is small.

In the present embodiment, the residual stress is determined using Raman spectroscopy as follows. First, a cross sectional sample parallel to the normal direction of the surface of the substrate is prepared. The cross section of the prepared cross sectional sample is formed into a mirror surface by performing cross section polisher processing (CP processing) using Ar ions. Thereafter, laser is emitted to the $Al_2O_3$ layer at the mirror surface under below-described conditions, and a Raman scattering spectrum is detected. On this occasion, for the region interposed between the ridgeline (or imaginary ridgeline) and the imaginary line separated by 4 mm from the ridgeline on the rake face, the laser is emitted to points each at a distance of 400 μm from the ridgeline. Then, the residual stress of the $Al_2O_3$ layer at each point of the region is analyzed based on the Raman spectrum detected at each point of the region.

The residual stress is determined by checking the wavenumber of the peak top of a peak originating from the $\alpha$-$Al_2O_3$ crystal. That is, when the wave number of the peak top of the peak originated from the $\alpha$-$Al_2O_3$ crystal is smaller than 418 $cm^{-1}$, it can be determined that the tensile residual stress is applied to the $Al_2O_3$ layer. When the wave number of the peak top of the peak originated from the $\alpha$-$Al_2O_3$ crystal is larger than 418 $cm^{-1}$, it can be determined that the compressive residual stress is applied to the $Al_2O_3$ layer. Examples of a Raman spectroscopic analyzer include LabRAM HR-800 (manufactured by HORIBA JOBIN YVON).

Measurement Conditions in the Raman Spectroscopy
 Laser wavelength: 532 nm
 Laser-irradiated position: the central portion of the $Al_2O_3$ layer in the thickness direction
 Measurement temperature: 25° C.

In the cutting tool including the $Al_2O_3$ layer having the above-described feature, the compressive residual stress is intensively provided to the predetermined region of the rake face. Therefore, the breakage resistance and wear resistance are excellent in the case of cutting involving a larger load on the rake face side than a load on the cutting edge portion.
(Thickness of $Al_2O_3$ Layer)

In the present embodiment, the thickness of the $Al_2O_3$ layer is preferably 1 to 15 μm, and is more preferably 2 to 10 μm. Thus, the above-described excellent effect can be exhibited.

When the thickness of the $Al_2O_3$ layer is less than 1 μm, a degree of improvement in wear resistance due to the presence of the $Al_2O_3$ layer tends to be low. When the thickness of the $Al_2O_3$ layer is more than 15 μm, interface stress due to a difference in linear expansion coefficient between the $Al_2O_3$ layer and the other layer(s) is increased, with the result that $\alpha$-$Al_2O_3$ crystal grains may fall off. The thickness of the $Al_2O_3$ layer can be confirmed by observing the vertical cross section of each of the substrate and the coating film using a scanning transmission electron microscope (STEM) or the like in the same manner as described above.

(Underlying Layer)

The coating film preferably further includes an underlying layer provided between the substrate and the $Al_2O_3$ layer. The underlying layer is preferably composed of a compound represented by TiN.

The thickness of the underlying layer is preferably 0.1 to 1 μm, and is more preferably 0.1 to 0.5 μm. The thickness of the underlying layer can be confirmed by observing the vertical cross section of each of the substrate and the coating film using a scanning transmission electron microscope (STEM) or the like in the same manner as described above.
(Inner Layer)

Figure 8:
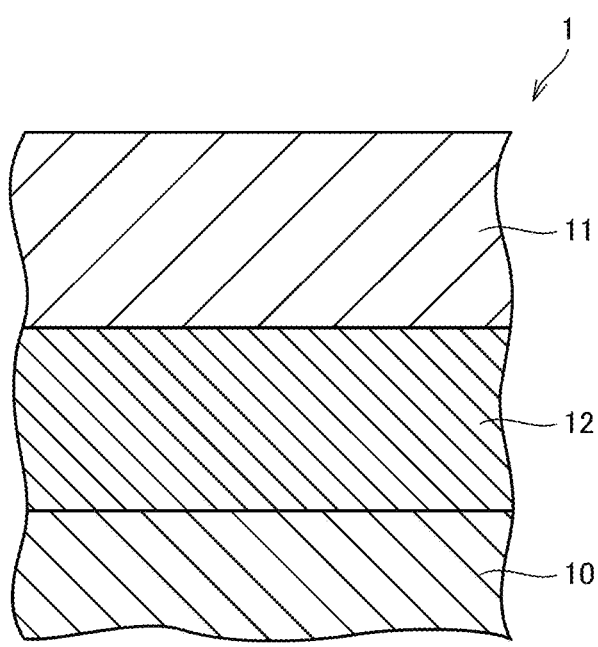
FIG. 8 is a schematic cross sectional view illustrating another implementation of the cutting tool.

The coating film preferably further includes an inner layer 12 provided between substrate 10 and $Al_2O_3$ layer 11 (for example, FIG. 8). Inner layer 12 is preferably composed of a compound represented by TiCN. In one aspect of the present embodiment, the coating film may further include an inner layer provided between the underlying layer and the $Al_2O_3$ layer, and the inner layer may be composed of a compound represented by TiCN.

The compound represented by TiCN preferably has a cubic crystal structure.

The thickness of the inner layer is preferably 1 to 15 μm, and is more preferably 2 to 10 μm. The thickness of the inner layer can be confirmed by observing the vertical cross section of each of the substrate and the coating film using a scanning transmission electron microscope (STEM) or the like in the same manner as described above.
(Intermediate Layer)

Preferably, the coating film further includes an intermediate layer provided between the inner layer and the $Al_2O_3$ layer, and the intermediate layer is composed of a compound including a titanium element and at least one element selected from a group consisting of C (carbon), N (nitrogen), B (boron) and O (oxygen). Here, the intermediate layer may have a composition different from that of the inner layer.

Examples of the compound included in the intermediate layer include TiCNO, TiBN, and the like.

The thickness of the intermediate layer is preferably 0.3 to 2.5 μm, and is more preferably 0.5 to 1 μm. The thickness of the intermediate layer can be confirmed by observing the vertical cross section of each of the substrate and the coating film using a scanning transmission electron microscope (STEM) or the like in the same manner as described above.
(Other Layer(s))

As long as the effect exhibited by the cutting tool according to the present embodiment is not compromised, the coating film may further include other layer(s) such as the outermost layer. The other layer(s) may have a different or the same composition from or as that of the $Al_2O_3$ layer, the underlying layer, the inner layer, or the intermediate layer. Examples of a compound included in the other layer(s) include TiN, TiCN, TiBN, $Al_2O_3$, and the like. It should be noted that an order of layering the other layer(s) is particularly not limited. The thickness of each of the other layer(s) is not particularly limited as long as the effect of the present embodiment is not compromised. For example, the thickness of each of the other layer(s) is more than or equal to 0.1 μm and less than or equal to 20 μm. The thickness of each of the other layer(s) can be confirmed by observing a vertical cross section of each of the substrate and the coating film using a scanning transmission electron microscope (STEM) or the like in the same manner as described above.
<<Method of Producing Surface-Coated Cutting Tool>>

A method of producing a cutting tool according to the present embodiment is a method of producing the above-described cutting tool, the method including:

- a step (hereinafter, also referred to as "first step") of preparing the above-described substrate having the rake face;
- a step (hereinafter, also referred to as "second step") of forming the coating film including the above-described $Al_2O_3$ layer on the substrate using a chemical vapor deposition method; and
- a step (hereinafter, also referred to as "third step") of performing a blasting process onto the $Al_2O_3$ layer at the rake face.

<First Step: Step of Preparing Substrate>

In the first step, the substrate is prepared. For example, a cemented carbide substrate is prepared as the substrate. For the cemented carbide substrate, a commercially available cemented carbide substrate may be used or a cemented carbide substrate may be produced using a general powder metallurgy method. In the production using the general powder metallurgy method, for example, WC powder, Co powder, and the like are mixed using a ball mill or the like to obtain a powder mixture. This powder mixture is dried and then is formed into a predetermined shape, thereby obtaining a shaped body. Further, by sintering the shaped body, a WC—Co based cemented carbide (sintered material) is obtained. Next, this sintered material is subjected to a predetermined cutting edge process such as honing, thereby producing a substrate composed of the WC—Co based cemented carbide. In the first step, any conventionally known substrate of this type other than the above-described substrate can be prepared.

<Second Step: Step of Forming Coating Film Including $Al_2O_3$ Layer on Substrate>

In the second step, the coating film including the $Al_2O_3$ layer is formed on the substrate using the chemical vapor deposition method (CVD method).

Figure 9:
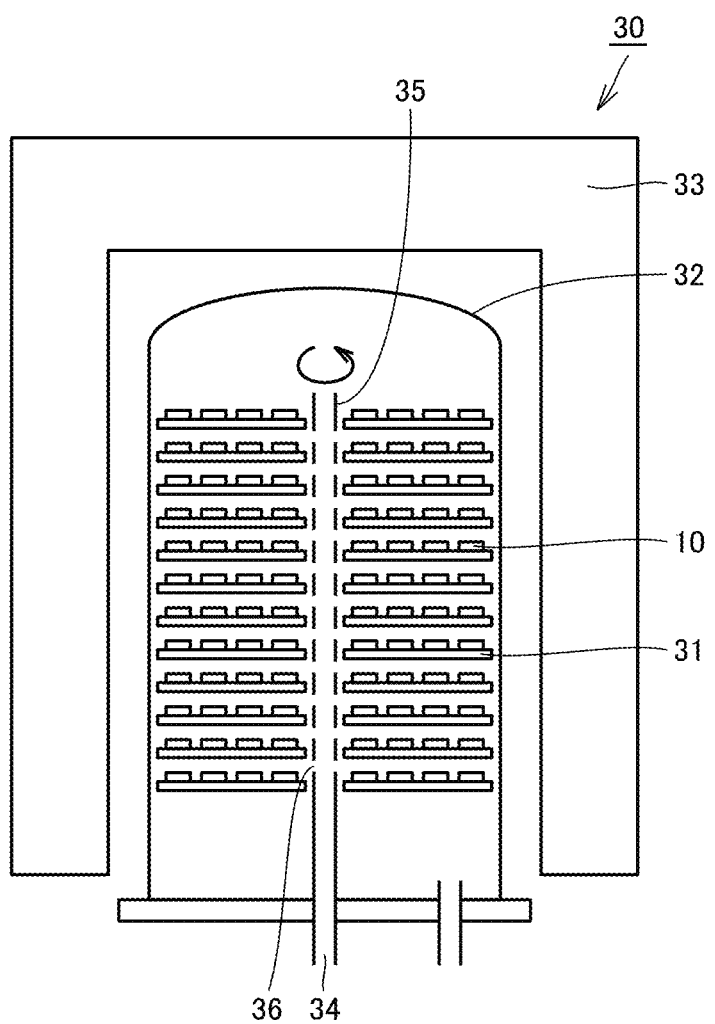
FIG. 9 is a schematic cross sectional view showing an exemplary chemical vapor deposition apparatus used to produce a coating film.

FIG. 9 is a schematic cross sectional view showing an exemplary chemical vapor deposition apparatus (CVD apparatus) used to produce the coating film. The following describes the second step with reference to FIG. 9. A CVD apparatus 30 includes: a plurality of substrate setting jigs 31 for holding substrates 10; and a reaction container 32 that is composed of a heat-resistant alloy steel and that covers substrate setting jigs 31. Moreover, a temperature adjusting apparatus 33 for controlling a temperature in reaction container 32 is provided to surround reaction container 32. A gas inlet pipe 35 provided with a gas inlet 34 is provided in reaction container 32. Gas inlet pipe 35 is disposed to extend vertically in an inner space of reaction container 32 in which substrate setting jigs 31 are disposed, is disposed to be rotatable with respect to the vertical direction, and is provided with a plurality of jetting holes 36 (through holes 36) for jetting gas into reaction container 32. By using this CVD apparatus 30, $Al_2O_3$ layer 11 or the like to be included in the coating film can be formed in the following manner.

First, substrate 10 is placed on substrate setting jig 31, and a source material gas for $Al_2O_3$ layer 11 is introduced from gas inlet pipe 35 into reaction container 32 while controlling the temperature and pressure in reaction container 32 to fall within predetermined respective ranges. Thus, $Al_2O_3$ layer 11 is formed on substrate 10. Here, before forming $Al_2O_3$ layer 11, inner layer 12 is preferably formed on the surface of substrate 10 by introducing a source material gas for inner layer 12 from gas inlet pipe 35 into reaction container 32. The following describes a method of forming $Al_2O_3$ layer 11 after forming inner layer 12 on the surface of substrate 10.

The source material gas for inner layer 12 is not particularly limited, and examples thereof include a mixed gas of $TiCl_4$, $CH_4$, CO, $N_2$ and HCl.

When forming inner layer 12, a temperature in reaction container 32 is preferably controlled to fall within a range of 1000 to 1100° C., and a pressure in reaction container 32 is preferably controlled to fall within a range of 0.1 to 1013 hPa. It should be noted that $H_2$ is preferably used as the carrier gas. Further, when introducing the gas, gas inlet pipe 35 is preferably rotated by a driving unit (not shown). In this way, each gas can be uniformly distributed in reaction container 32.

Further, inner layer 12 may be formed by an MT (Medium Temperature)-CVD method. Unlike a CVD method (hereinafter, also referred to as "HT-CVD method") performed at a temperature of 1000 to 1100° C., the MT-CVD method is a method of forming a layer with the temperature in reaction container 32 being maintained at a comparatively low temperature such as 800 to 950° C. Since the MT-CVD method is performed at such a comparatively low temperature as compared with the HT-CVD method, damage on substrate 10 by heating can be reduced. In particular, when inner layer 12 is a TiCN layer (layer composed of a compound represented by TiCN), inner layer 12 is preferably formed by the MT-CVD method.

Next, $Al_2O_3$ layer 11 is formed on inner layer 12. As a source material gas, for example, a mixed gas of $AlCl_3$, $CO_2$, and $H_2S$ is used. It should be noted that as a carrier gas, a generally used $H_2$ carrier gas may be used.

A flow rate of $AlCl_3$ is preferably 0.5 to 2.5 L/min. A flow rate of $CO_2$ is preferably 0.1 to 4 L/min. A flow rate of $H_2S$ is preferably 0.1 to 2 L/min. On this occasion, the volume ratio of $CO_2$ to $H_2S$ ($CO_2/H_2S$) is preferably 0.5 to 1.

The temperature in reaction container 32 is preferably controlled to fall within a range of 950 to 1000° C., and the pressure in reaction container 32 is preferably controlled to fall within a range of 50 to 100 hPa. By controlling the temperature to fall within the above range, a fine $\alpha$-$Al_2O_3$ grain structure is facilitated to be formed. As the carrier gas, $H_2$ can be used. It should be noted that as with the case described above, gas inlet pipe 35 is preferably rotated when introducing the gas.

Regarding the above-described production method, a configuration of each layer is changed by controlling each condition of the CVD method. For example, the composition of each layer is determined by the composition of the source material gas introduced into reaction container 32. The thickness of each layer is controlled by an execution time (film formation time). In particular, in order to decrease a ratio of coarse grains in $Al_2O_3$ layer 11, it is important to control the ratio ($CO_2/H_2S$) of the flow rates of the $CO_2$ gas and the $H_2S$ gas of the source material gases.

It should be noted that the above-described underlying layer or intermediate layer may be formed between substrate 10 and $Al_2O_3$ layer 11, or the outermost layer may be formed on $Al_2O_3$ layer 11, as long as the effect of the cutting tool according to the present embodiment is not compromised. The method of forming the outermost layer is not particularly limited, and examples thereof include a method of forming the outermost layer by the CVD method or the like.

<Third Step: Step of Performing Blasting Process>

Figure 10:
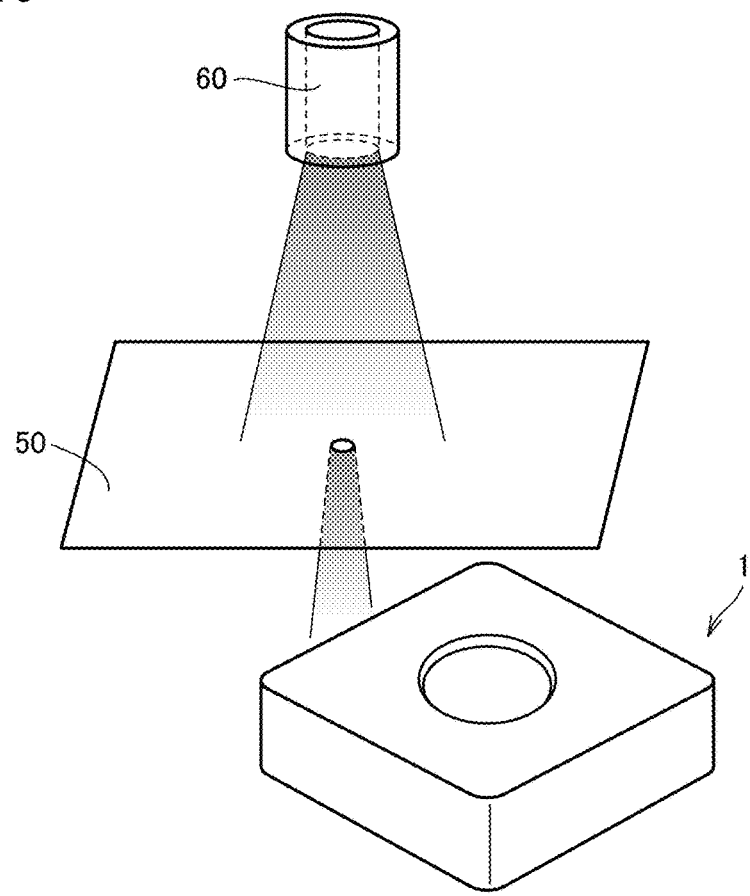
FIG. 10 is a schematic diagram illustrating a blasting process according to the present embodiment.

In the step of performing the blasting process, the $Al_2O_3$ layer at the rake face is subjected to the blasting process. Preferably, the step of performing the blasting process includes sending out media onto the $Al_2O_3$ layer at the rake face in a sending direction of 70 to 90° with respect to the rake face (for example, FIG. 10). On this occasion, the blasting process may be performed with a restriction plate 50 being placed between cutting tool 1 and a sending unit 60 for sending out the media as shown in FIG. 10, restriction plate 50 being provided with a hole through which the media are to pass. By placing restriction plate 50, the media can be intensively sent out onto the $Al_2O_3$ layer at the rake face through the hole of restriction plate 50. The hole diameter of the hole provided in restriction plate 50 is preferably 500 to 2000 μm. The thickness of restriction plate 50 is preferably 0.5 to 3 mm.

In one aspect of the present embodiment, the step of performing the blasting process may include sending out the media onto the $Al_2O_3$ layer at the rake face after performing a masking process onto the cutting edge portion and the flank face.

The "blasting process" means a process of hitting a surface such as the rake face by a multiplicity of small spheres (media) such as steel or non-ferrous metal (for example, ceramic) (process of sending out the small spheres onto the surface) at a high speed so as to change various characteristics of the surface such as residual stress.

Conventionally, a region to be subjected to the blasting process is not particularly limited, and the blasting process is performed onto a wide range in a target layer of the coating film. However, in such a wide-range blasting process, compressive residual stress is provided to a wide range in the cutting tool, and the required compressive residual stress value is not reached. Moreover, in the wide-range blasting process, the media also hit the cutting edge portion, thereby causing detachment of the coating film or wear of the coating film at the cutting edge portion. In the present embodiment, by intensively performing the blasting process onto the rake face in the sending direction of 70 to 90° with respect to the rake face, the compressed residual stress is intensively provided to region d1 of the rake face while reducing a frequency of the cutting edge portion being hit by the media. This results in excellent breakage resistance in the case of cutting involving a larger load on the rake face side than a load on the cutting edge portion. The sending of the media is not particularly limited as long as the media are sent out in the sending direction of 70 to 90° with respect to the rake face, and the media may be sent out directly onto the $Al_2O_3$ layer, for example. Alternatively, the blasting process may be performed onto the $Al_2O_3$ layer by sending out the media onto another layer (for example, the outermost layer) provided on the $Al_2O_3$ layer.

Examples of the material of the media include steel, ceramic, aluminum oxide, zirconium oxide, and the like.

The average particle size of the media is preferably 40 to 200 μm, and is more preferably 50 to 80 μm, for example.

Commercially available media may be used as the media.

A distance (hereinafter, also referred to as "sending distance") between the surface of the rake face and the sending unit for sending out the media is preferably 30 mm to 200 mm, and is more preferably 50 mm to 100 mm.

When the media are sent out with the restriction plate being placed therebetween, a distance between the restriction plate and the surface of the flank face is preferably 20 mm to 40 mm, and is more preferably 20 mm to 30 mm.

A pressure (hereinafter, also referred to as "sending pressure") applied to the media during the sending is preferably 0.1 MPa to 0.25 MPa, and is more preferably 0.12 MPa to 0.18 MPa.

A blasting process time is preferably 5 seconds to 60 seconds, and is more preferably 5 seconds to 20 seconds.

Each condition of the blasting process can be appropriately adjusted in accordance with the configuration of the coating film.

<Other Step(s)>

In the production method according to the present embodiment, in addition to the above-described steps, additional step(s) may be appropriately performed as long as the effect of the present embodiment is not compromised.

The above description includes features additionally described as follows.

(Clause 1)

A surface-coated cutting tool including a rake face and a flank face, the surface-coated cutting tool comprising:
   a substrate; and
   a coating film that coats the substrate, wherein
   the coating film includes an $Al_2O_3$ layer,
   residual stress of the $Al_2O_3$ layer has a minimum value $R_{min}$ at at least a portion of a region d1 in the rake face,
   the minimum value Renin is more than −0.27 GPa and less than or equal to −0.1 GPa,
   in a case where the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, the imaginary line D2 being separated by 3 mm from the imaginary ridgeline on the rake face, and
   in a case where the rake face and the flank face are connected to each other via a ridgeline, the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

(Clause 2)

The surface-coated cutting tool according to clause 1, wherein
   in the case where the rake face and the flank face are connected to each other via the cutting edge face, a cutting edge portion is a region interposed between a boundary line between the rake face and the cutting edge face and a boundary line between the flank face and the cutting edge face,
   in the case where the rake face and the flank face are connected to each other via the ridgeline, the cutting edge portion is a region interposed between the ridgeline and an imaginary line D3 separated by 500 μm from the ridgeline on the rake face and a region interposed between the ridgeline and an imaginary line D4 separated by 500 μm from the ridgeline on the flank face, and
   residual stress of the $Al_2O_3$ layer at the cutting edge portion is more than or equal to −0.08 GPa and less than or equal to 0 GPa.

(Clause 3)

The surface-coated cutting tool according to clause 1 or 2, further comprising an inner layer provided between the substrate and the $Al_2O_3$ layer, wherein the inner layer is composed of a compound represented by TiCN.

(Clause 4)

The surface-coated cutting tool according to any one of clauses 1 to 3, wherein the minimum value $R_{min}$ is more than −0.27 GPa and less than or equal to −0.15 GPa.

Examples

Hereinafter, the present invention will be described in detail with reference to examples, but the present invention is not limited thereto.

<<Production of Cutting Tool>>
<First Step: Step of Preparing Substrate>

As substrates, there were prepared two types of indexable cutting inserts (shape: SEET13T3AGSN-G and SEEN1203AGSN manufactured by Sumitomo Electric Hardmetal) each composed of cemented carbide having a composition consisting of TaC (2.0 wt %), Co (11.0 wt %) and WC (remainder) (but an inevitable impurity was included). The cutting insert composed of the cemented carbide and having the shape of SEET13T3AGSN-G corresponds to the shape in which the rake face and the flank face are connected to each other via the cutting edge face. The cutting insert composed of the cemented carbide and having the shape of SEEN1203AGSN corresponds to the shape in which the rake face and the flank face are connected to each other via the ridgeline.

<Second Step: Step of Forming Coating Film>

An underlying layer, an inner layer, an intermediate layer, and an $Al_2O_3$ layer were formed in this order on the prepared substrate using a CVD apparatus to form a coating film on a surface of each of the substrates. Here, the underlying layer, the intermediate layer, and the $Al_2O_3$ layer were formed by the HT-CVD method, and the inner layer was formed by the MT-CVD method. Conditions for forming each layer are shown below. It should be noted that a value in parentheses following each gas composition indicates a flow rate (L/min) of the gas. The respective thicknesses of the underlying layer, the inner layer, the intermediate layer, and the $Al_2O_3$ layer are shown in Tables 1-1 and 1-2.

(Underlying Layer: TiN)
  Source material gas: $TiCl_4$ (0.002 L/min), $CH_4$ (2.0 L/min), CO (0.3 L/min), $N_2$ (6.5 L/min), HCl (1.8 L/min), and $H_2$ (50 L/min)
  Pressure: 160 hPa
  Temperature: 1000° C.
  Film formation time: appropriately adjusted to attain the thickness shown in Table 1-1 or Table 1-2.

(Inner Layer: TiCN)
  Source material gas: $TiCl_4$ (0.002 L/min), $CH_4$ (2.0 L/min), CO (0.3 L/min), $N_2$ (6.5 L/min), HCl (1.8 L/min), and $H_2$ (50 L/min)
  Pressure: 160 hPa
  Temperature: 950° C.
  Film formation time: appropriately adjusted to attain the thickness shown in Table 1-1 or Table 1-2.

(Intermediate Layer: TiCNO)
  Source material gas: $TiCl_4$ (0.003 L/min), CO (0.5 L/min), $H_2$ (40 L/min), $N_2$ (6.7 L/min), $CH_4$ (2.2 L/min), and HCl (1.5 L/min)
  Pressure: 400 hPa
  Temperature: 1010° C.
  Film formation time: appropriately adjusted to attain the thickness shown in Table 1-1 or Table 1-2.

($Al_2O_3$ Layer)
  Source material gas: $AlCl_3$ (1.5 L/min), $CO_2$ (1 L/min), and $H_2S$ (1.4 L/min)
  Pressure: 70 hPa
  Temperature: 1000° C.
  Film formation time: appropriately adjusted to attain the thickness shown in Table 1-1 or Table 1-2.

TABLE 1-1

| | Film Structure and Thickness (μm) | | | | Residual Stress Value | | |
| --- | --- | --- | --- | --- | --- | --- | --- |
| | | | | | Rake Face | | Cutting |
| Sample No. | Underlying Layer TiN | Inner Layer TiCN | Intermediate Layer TiCNO | $Al_2O_3$ Layer $\alpha$-$Al_2O_3$ | Minimum Value (GPa) | Position with Minimum Value* (mm) | Edge Portion (GPa) |
| 1 | 0.4 | 6.2 | 0.7 | 4.1 | −0.2 | 3 | −0.07 |
| 2 | 0.4 | 5.9 | 0.5 | 3.9 | −0.22 | 2 | −0.08 |
| 3 | 0.4 | 6.4 | 0.5 | 4.2 | −0.21 | 1.1 | −0.06 |
| 4 | 0.4 | 5.9 | 0.7 | 4.1 | −0.27 | 2 | −0.18 |
| 5 | 0.4 | 6.2 | 0.5 | 4.2 | −0.23 | 0.5 | −0.21 |
| 6 | 0.4 | 6.2 | 0.7 | 4.3 | −0.23 | 3.9 | −0.01 |
| 7 | 0.4 | 6.3 | 0.7 | 4.4 | −0.05 | 1.5 | −0.09 |
| 8 | 0.4 | 5.9 | 0.8 | 4.2 | −0.13 | 0 | −0.13 |
| 9 | 0.4 | 5.8 | 0.5 | 4.4 | −0.07 | 0 | −0.07 |
| 10 | 0.4 | 6.5 | 0.5 | 3.9 | 0.05 | 0 | 0.04 |
| 11 | 0.4 | 6.2 | 0.5 | 3.9 | −0.15 | 1.2 | −0.04 |
| 12 | 0.4 | 6.1 | 0.5 | 3.9 | −0.1 | 1.5 | −0.03 |

*indicates a distance from the imaginary ridgeline on the rake face.

TABLE 1-2

| | Film Structure and Thickness (μm) | | | | Residual Stress Value | | |
| --- | --- | --- | --- | --- | --- | --- | --- |
| | | | | | Rake Face | | Cutting |
| Sample No. | Underlying Layer TiN | Inner Layer TiCN | Intermediate Layer TiCNO | $Al_2O_3$ Layer $\alpha$-$Al_2O_3$ | Minimum Value (GPa) | Position with Minimum Value* (mm) | Edge Portion (GPa) |
| 21 | 0.4 | 6.2 | 0.5 | 3.9 | −0.22 | 3.0 | −0.04 |
| 22 | 0.4 | 5.9 | 0.6 | 4.2 | −0.15 | 1.5 | −0.03 |
| 23 | 0.4 | 5.9 | 0.7 | 4.1 | −0.25 | 0.5 | −0.20 |
| 24 | 0.4 | 6.1 | 0.5 | 4.1 | −0.08 | 1.1 | −0.03 |
| 25 | 0.4 | 6.0 | 0.7 | 4.2 | −0.13 | 0.0 | −0.13 |

TABLE 1-2-continued

| | Film Structure and Thickness (μm) | | | | Residual Stress Value | | |
| --- | --- | --- | --- | --- | --- | --- | --- |
| | | | | | Rake Face | | Cutting |
| Sample No. | Underlying Layer TiN | Inner Layer TiCN | Intermediate Layer TiCNO | $Al_2O_3$ Layer $\alpha$-$Al_2O_3$ | Minimum Value (GPa) | Position with Minimum Value* (mm) | Edge Portion (GPa) |
| 26 | 0.4 | 6.2 | 0.6 | 3.9 | −0.07 | 0.0 | −0.07 |
| 27 | 0.4 | 6.4 | 0.5 | 3.9 | 0.05 | 2.0 | 0.04 |

*indicates a distance from the imaginary ridgeline on the rake face.

<Third Step: Step of Performing Blasting Process>

Next, among the cutting inserts (cutting tools) having the above-described respective coating films formed thereon, the surface of the cutting tool including the rake face in each of samples No. 1 to No. 9, No. 11, and No. 12 and samples No. 21 to No. 26 was subjected to a blasting process under the following conditions. Samples No. 10 and No. 27 were not subjected to the blasting process.

(Blasting Conditions)

Media: media composed of alumina (average particle size: 60 μm)
Media concentration: 10 wt %
Use of restriction plate: used (samples No. 1 to No. 6, No. 11, No. 12 and No. 21 to No. 24) and not used (samples No. 7 to No. 9, No. 25 and No. 26)
Hole diameter of the restriction plate: 1000 μm
Thickness of the restriction plate: 1.5 mm
Sending angle: direction of 90° with respect to the rake face (samples No. 1 to No. 7, No. 11, No. 12 and No. 21 to No. 24)
  direction of 45° with respect to the rake face (samples No. 8, No. 9, No. 25 and No. 26)
Sending pressure: 0.10 MPa
Sending time: 8 seconds With the above procedure, the cutting tools of samples No. 1 to No. 12 and No. 21 to No. 27 were produced. The cutting tools of samples No. 1 to No. 3, No. 11, No. 12, No. 21 and No. 22 correspond to the examples of the present disclosure. The cutting tools of samples No. 4 to No. 10 and No. 23 to No. 27 correspond to comparative examples. Each of the cutting tools of samples No. 1 to No. 12 is a cutting tool having the shape of SEET13T3AGSN-G. Each of the cutting tools of samples No. 21 to No. 27 is a cutting tool having the shape of SEEN1203AGSN.

<<Evaluations on Characteristics of Cutting Tool>>
<Measurement of Residual Stress Value in Rake Face>

Figure 11:
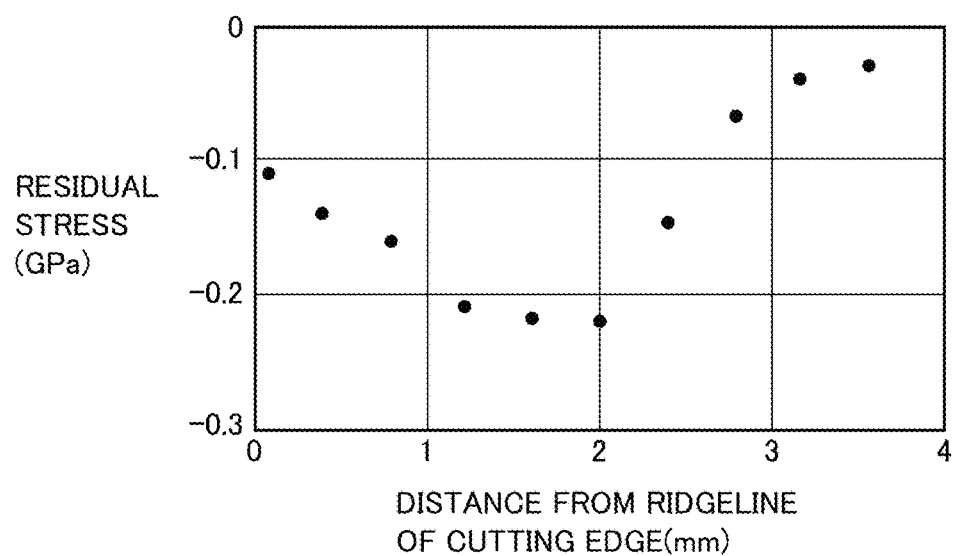
FIG. 11 is a graph showing a relation between residual stress of a rake face and a distance from a cutting edge portion in a cutting tool of a sample No. 2.

A residual stress value in the rake face of the cutting tool of each of samples No. 1 to No. 12 and No. 21 to No. 27 was measured in the following procedure. First, a cross sectional sample parallel to the normal direction of the surface of the substrate was prepared. The cross section of the prepared cross sectional sample was formed into a mirror surface by performing cross section polisher processing (CP processing) using Ar ions. Thereafter, laser was emitted to the $Al_2O_3$ layer at the mirror surface under below-described conditions and a Raman scattering spectrum was detected. On this occasion, in each of the cutting tools of samples No. 1 to No. 12, for a region interposed between the imaginary ridgeline and the imaginary line separated by 4 mm from the imaginary ridgeline on the rake face, the laser was emitted to points each at a distance of 400 μm from the imaginary ridgeline. In each of the cutting tools of samples No. 21 to No. 27, for a region interposed between the ridgeline and the imaginary line separated by 4 mm from the ridgeline on the rake face, the laser was emitted to points each at a distance of 400 μm from the ridgeline. Then, the residual stress of the $Al_2O_3$ layer at each point of the region was analyzed based on the Raman spectrum detected at each point of the region. Based on the analysis, a graph (for example, FIG. 11) was prepared to indicate a relation between residual stress (vertical axis) of the rake face of the cutting tool and a distance (horizontal axis) from the cutting edge portion, thereby finding the minimum value of the residual stress value and a position with the minimum value on the rake face. Results are shown in Tables 1-1 and 1-2. In Table 1-1, it is indicated that when the position with the minimum value in the rake face is "0 mm", the minimum value is obtained at the cutting edge face. In Table 1-2, it is indicated that when the position with the minimum value in the rake face is "0 mm", the minimum value is obtained at the cutting edge portion.

Measurement Conditions for Raman Spectroscopy

Raman Spectroscopic Analyzer: LabRAM HR-800 (trademark; manufactured by HORIBA JOBIN YVON)
Laser wavelength: 532 nm
Laser-irradiated position: the central portion of the $Al_2O_3$ layer in the thickness direction
Measurement temperature: 25° C.

<Measurement of Residual Stress Value at Cutting Edge Portion>

In the same procedure as described above, the residual stress value of the cutting edge portion (cutting edge face) of the cutting tool of each of samples No. 1 to No. 12 and No. 21 to No. 27 was measured. That is, in the above-described mirror-finished cross sectional sample, laser was emitted to the $Al_2O_3$ layer at the cutting edge portion under the above-described conditions, and a Raman scattering spectrum was detected. Then, the residual stress of the $Al_2O_3$ layer at the cutting edge portion was analyzed based on the detected Raman spectrum. Results are shown in Tables 1-1 and 1-2.

<Observation on Coating Film at Cutting Edge Portion>

An electron microscope was used to observe a state of the coating film at the cutting edge portion of the cutting tool of each of samples No. 1 to No. 12 and No. 21 to No. 27. The cutting tool yet to be used for cutting was used. Results are shown in Tables 2-1 and 2-2.

<<Cutting Test: Samples No. 1 to No. 12>>
<Cutting Test 1: Breakage Resistance Test>

Each of the cutting tools of samples No. 1 to No. 12 produced as described above was used to measure a cutting length (mm) until breakage occurred at the cutting edge under the following cutting conditions. Results are shown in Table 2-1. As the cutting distance is longer, the cutting tool can be evaluated to have more excellent breakage resistance.

Conditions of Breakage Resistance Test

Workpiece: S50C (block material with φ8 hole)
Tool: WGC4160R/SEET13T3AGSN-G
Cutting speed: 300 m/min
Amount of feeding: 0.3 mm/t Amount of cut: 2.0 mm
Cutting width: 50 mm
Cutting oil: dry type <Cutting Test 2: Wear Resistance Test>

Each of the cutting tools of samples No. 1 to No. 12 produced as described above was used to perform cutting for ten passes with one pass being 300 mm under the following cutting conditions. Whenever cutting was performed for one pass, an average wear amount Vb (mm) of the flank face side of the cutting tool was measured. Results of wear amounts Vb (mm) of the flank faces after the 10 passes are shown in Table 2-1. As the amount of wear of the flank face is smaller, the cutting tool can be evaluated to have more excellent wear resistance.

Conditions of Wear Resistance Test
Workpiece: SKD11 (block material with W80× L300)
Tool: WGC4160R/SEET13T3AGSN-G
Cutting speed: 150 m/min
Amount of feeding: 0.2 mm/t
Cutting width: 80 mm (center cut)
Amount of cut: 2.0 mm Respective performances of the cutting tools of samples No. 1 to No. 12 were ranked under the following criteria based on the observations on the coating films at the cutting edge portions as well as the results of cutting tests 1 and 2.

A: The cutting length was more than or equal to 1500 mm in cutting test 1 and the wear amount was less than or equal to 0.1 mm in cutting test 2.
B: The cutting length was more than or equal to 1500 mm in cutting test 1 or the wear amount was less than or equal to 0.1 mm in cutting test 2.
C: The cutting length was more than 250 mm and less than or equal to 1500 mm in cutting test 1 and the wear amount was more than or equal to 0.1 mm in cutting test 2.
D: The cutting length was less than or equal to 250 mm in cutting test 1.

TABLE 2-1

| Sample No. | Cutting Test 1 Cutting Length (mm) | Cutting Test 2 Vb (mm) | Remaining State of Coating Film at Cutting Edge Portion | Performance Ranking |
|---|---|---|---|---|
| 1 | 1500 | 0.08 | No Falling of Coating Film | A |
| 2 | 1550 | 0.07 | No Falling of Coating Film | A |
| 3 | 1500 | 0.07 | No Falling of Coating Film | A |
| 4 | 1550 | 0.15 | Falling of Coating Film | B |
| 5 | 950 | 0.08 | No Falling of Coating Film | B |
| 6 | 1000 | 0.08 | No Falling of Coating Film | B |
| 7 | 600 | 0.08 | No Falling of Coating Film | B |
| 8 | 700 | 0.15 | Falling of Coating Film | C |
| 9 | 250 | 0.08 | No Falling of Coating Film | D |
| 10 | 50 | 0.17 | No Falling of Coating Film | D |
| 11 | 1500 | 0.08 | No Falling of Coating Film | A |
| 12 | 1500 | 0.07 | No Falling of Coating Film | A |

In view of the results of cutting test 1 (Table 2-1), the cutting length of each of the cutting tools (samples No. 1 to No. 3, No. 11, and No. 12) according to the examples of the present disclosure was more than or equal to 1500 mm. On the other hand, in some of the cutting tools according to the comparative examples, the cutting length was less than or equal to 1000 mm (samples No. 5 to No. 10).

Further, in view of the results of cutting test 2 (Table 2-1), the wear amount (Vb) of the flank face of each of the cutting tools (samples No. 1 to No. 3, No. 11, and No. 12) according to the examples of the present disclosure was less than or equal to 0.08 mm. On the other hand, in some of the cutting tools according to the comparative examples, the wear amount (Vb) was more than 0.1 mm (samples No. 4, No. 8 and No. 10).

In view of the results of cutting tests 1 and 2, it was found that each of the cutting tools (samples No. 1 to No. 3, No. 11, and No. 12) according to the examples of the present disclosure was more excellent in breakage resistance and wear resistance than the cutting tools (samples No. 4 to 10) according to the comparative examples because the predetermined residual stress was provided in the predetermined region of the rake face.

<<Cutting Test: Samples No. 21 to No. 27>>

<Cutting Test 1: Breakage Resistance Test>

Each of the cutting tools of samples No. 21 to No. 27 produced as described above was used to measure a cutting length (mm) until breakage occurred at the cutting edge under the following cutting conditions. Results are shown in Table 2-2. As the cutting distance is longer, the cutting tool can be evaluated to have more excellent breakage resistance.

Conditions of Breakage Resistance Test
Workpiece: S50C (block material with φ8 hole)
Tool: EHG4160R/SEEN1203AGSN
Cutting speed: 300 m/min
Amount of feeding: 0.15 mm/t
Amount of cut: 2.0 mm
Cutting width: 50 mm
Cutting oil: dry type <Cutting Test 2: Wear Resistance Test>

Each of the cutting tools of samples No. 21 to No. 27 produced as described above was used to perform cutting for ten passes with one pass being 300 mm under the following cutting conditions. Whenever cutting was performed for one pass, an average wear amount Vb (mm) of the flank face side of the cutting tool was measured. Results of wear amounts Vb (mm) of the flank faces after the 10 passes are shown in Table 2-2. As the amount of wear of the flank face is smaller, the cutting tool can be evaluated to have more excellent wear resistance.

Conditions of Wear Resistance Test
Workpiece: SKD11 (block material with W80×L300)
Tool: EHG4160R/SEEN1203AGSN
Cutting speed: 150 m/min
Amount of feeding: 0.10 mm/t
Amount of cut: 2.0 mm
Cutting width: 80 mm (center cut)
Amount of cut: 2.0 mm Respective performances of the cutting tools of samples No. 21 to No. 27 were ranked under the following criteria based on the observations on the coating films at the cutting edge portions as well as the results of cutting tests 1 and 2.

A: The cutting length was more than or equal to 1300 mm in cutting test 1 and the wear amount was less than or equal to 0.1 mm in cutting test 2.
B: The cutting length was more than or equal to 1300 mm in cutting test 1 or the wear amount was less than or equal to 0.1 mm in cutting test 2.
C: The cutting length was more than 100 mm and less than or equal to 500 mm in cutting test 1 and the wear amount was more than or equal to 0.09 mm in cutting test 2.
D: The cutting length was less than or equal to 100 mm in cutting test 1.

TABLE 2-2

| Sample No. | Cutting Test 1 Cutting Length (mm) | Cutting Test 2 Vb (mm) | Remaining State of Coating Film at Cutting Edge Portion | Performance Ranking |
|---|---|---|---|---|
| 21 | 1450 | 0.07 | No Falling of Coating Film | A |
| 22 | 1350 | 0.08 | No Falling of Coating Film | A |
| 23 | 1300 | 0.15 | Falling of Coating Film | B |
| 24 | 800 | 0.09 | No Falling of Coating Film | B |
| 25 | 350 | 0.15 | Falling of Coating Film | C |
| 26 | 200 | 0.09 | No Falling of Coating Film | C |
| 27 | 30 | 0.18 | No Falling of Coating Film | D |

In view of the results of cutting test 1 (Table 2-2), the cutting length of each of the cutting tools (samples No. 21 and No. 22) according to the examples of the present disclosure was more than or equal to 1300 mm. On the other hand, in some of the cutting tools according to the comparative examples, the cutting length was less than or equal to 1000 mm (samples No. 24 to No. 27).

Further, in view of the results of cutting test 2 (Table 2-2), the wear amount (Vb) of the flank face of each of the cutting tools (samples No. 21 and No. 22) according to the examples of the present disclosure was less than or equal to 0.08 mm. On the other hand, in some of the cutting tools according to the comparative examples, the wear amount (Vb) was more than 0.1 mm (samples No. 23, No. 25, and No. 27).

In view of the results of cutting tests 1 and 2, it was found that each of the cutting tools (samples No. 21 and No. 22) according to the examples of the present disclosure was more excellent in breakage resistance and wear resistance than the cutting tools according to the comparative examples (samples No. 23 to No. 27) because the predetermined residual stress was provided in the predetermined region of the rake face.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: cutting tool; 1a: rake face; 1b: flank face; 1c: cutting edge face; 1d: cutting edge portion, 10: substrate; 11: $Al_2O_3$ layer; 12: inner layer; 30: CVD apparatus; 31: substrate setting jig; 32: reaction container; 33: temperature adjusting apparatus; 34: gas inlet; 35: gas inlet pipe; 36: through hole; 50: restriction plate; 60: sending unit for sending out media; AB: ridgeline; AB': imaginary ridgeline; AA, BB: imaginary boundary line; D1, D2, D3, D4: imaginary line; d1: region d1

The invention claimed is:

1. A cutting tool including a rake face and a flank face, the cutting tool comprising:
a substrate; and
a coating film disposed on the substrate, wherein
the coating film includes an $Al_2O_3$ layer,
a residual stress of the $Al_2O_3$ layer has a minimum value $R_{min}$ at only a portion of a region d1 in the rake face,
the minimum value $R_{min}$ is more than −0.27 GPa and less than or equal to −0.1 GPa,
in a case where the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, the imaginary line D2 being separated by 3 mm from the imaginary ridgeline on the rake face, and
in a case where the rake face and the flank face are connected to each other via a ridgeline, the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

2. The cutting tool according to claim 1, wherein
residual stress of the $Al_2O_3$ layer at a cutting edge portion is more than or equal to −0.08 GPa and less than or equal to 0 GPa,
in the case where the rake face and the flank face are connected to each other via the cutting edge face, the cutting edge portion is a region interposed between a boundary line between the rake face and the cutting edge face and a boundary line between the flank face and the cutting edge face, and
in the case where the rake face and the flank face are connected to each other via the ridgeline, the cutting edge portion is a region interposed between the ridgeline and an imaginary line D3 separated by 500 µm from the ridgeline on the rake face and a region interposed between the ridgeline and an imaginary line D4 separated by 500 µm from the ridgeline on the flank face.

3. The cutting tool according to claim 1, wherein the coating film further includes an inner layer provided between the substrate and the $Al_2O_3$ layer, and the inner layer is composed of a compound represented by TiCN.

4. The cutting tool according to claim 1, wherein the minimum value $R_{min}$ is more than −0.27 GPa and less than or equal to −0.15 GPa.

5. The cutting tool according to claim 2, wherein the coating film further includes an inner layer provided between the substrate and the $Al_2O_3$ layer, and the inner layer is composed of a compound represented by TiCN.

6. The cutting tool according to claim 5, wherein the minimum value $R_{min}$ is more than −0.27 GPa and less than or equal to −0.15 GPa.

7. The cutting tool according to claim 2, wherein the minimum value $R_{min}$ is more than −0.27 GPa and less than or equal to −0.15 GPa.

8. The cutting tool according to claim 3, wherein the minimum value $R_{min}$ is more than −0.27 GPa and less than or equal to −0.15 GPa.

9. A cutting tool comprising:
a rake face and a flank face;
a substrate; and
a coating film disposed on the substrate, wherein
the coating film includes an $Al_2O_3$ layer,
a residual stress of the $Al_2O_3$ layer has a minimum value $R_{min}$ at only a portion of a region d1 in the rake face,
the minimum value $R_{min}$ is more than −0.27 GPa and less than or equal to −0.1 GPa,
the rake face and the flank face are connected to each other via a cutting edge face, the region d1 is a region interposed between an imaginary line D1 and an imaginary line D2, the imaginary line D1 being separated by 1 mm from an imaginary ridgeline on the rake face, the imaginary ridgeline being formed by intersection of a plane obtained by extending the rake face and a plane obtained by extending the flank face, and the imaginary line D2 being separated by 3 mm from the imaginary ridgeline on the rake face.

10. The cutting tool according to claim 9, wherein a cutting edge portion is a region interposed between a boundary line between the rake face and the cutting edge face and a boundary line between the flank face and the cutting edge face, and a residual stress of the $Al_2O_3$ layer at the cutting edge portion is more than or equal to −0.08 GPa and less than or equal to 0 GPa.

11. The cutting tool according to claim 10, wherein the coating film further includes an inner layer provided between the substrate and the $Al_2O_3$ layer, and the inner layer is composed of a compound represented by TiCN.

12. The cutting tool according to claim 9, wherein the minimum value $R_{min}$ is more than −0.27 GPa and less than or equal to −0.15 GPa.

13. A cutting tool comprising:
a rake face and a flank face;
a substrate; and
a coating film disposed on the substrate, wherein
the coating film includes an $Al_2O_3$ layer,
a residual stress of the $Al_2O_3$ layer has a minimum value $R_{min}$ at only at least a portion of a region d1 in the rake face,
the minimum value $R_{min}$ is more than −0.27 GPa and less than or equal to −0.1 GPa,
the rake face and the flank face are connected to each other via a ridgeline,
the region d1 is a region interposed between an imaginary line D1 and an imaginary line D2, the imaginary line D1 being separated by 1 mm from the ridgeline on the rake face, the imaginary line D2 being separated by 3 mm from the ridgeline on the rake face.

14. The cutting tool according to claim 13, wherein
a cutting edge portion is a region interposed between the ridgeline and an imaginary line D3 separated by 500 μm from the ridgeline on the rake face and a region interposed between the ridgeline and an imaginary line D4 separated by 500 μm from the ridgeline on the flank face, and a residual stress of the $Al_2O_3$ layer at the cutting edge portion is more than or equal to −0.08 GPa and less than or equal to 0 GPa.

15. The cutting tool according to claim 13, wherein
a cutting edge portion is a region interposed between a boundary line between the rake face and the cutting edge face and a boundary line between the flank face and the cutting edge face, and a residual stress of the $Al_2O_3$ layer at the cutting edge portion is more than or equal to −0.08 GPa and less than or equal to 0 GPa.

16. The cutting tool according to claim 15, wherein the coating film further includes an inner layer provided between the substrate and the $Al_2O_3$ layer, and the inner layer is composed of a compound represented by TiCN.

17. The cutting tool according to claim 13, wherein the minimum value $R_{min}$ is more than −0.27 GPa and less than or equal to −0.15 GPa.

* * * * *

UNITED STATES PATENT AND TRADEMARK OFFICE
CERTIFICATE OF CORRECTION

| | |
|---|---|
| PATENT NO. | : 12,220,747 B2 |
| APPLICATION NO. | : 17/600612 |
| DATED | : February 11, 2025 |
| INVENTOR(S) | : Fumiyoshi Kobayashi |

It is certified that error appears in the above-identified patent and that said Letters Patent is hereby corrected as shown below:

In the Claims

Column 23, Line 31, Claim 13, after "only" delete "at least".

Signed and Sealed this
Sixth Day of May, 2025

Coke Morgan Stewart
*Acting Director of the United States Patent and Trademark Office*